United States Patent
Maeda

(10) Patent No.: US 7,498,596 B2
(45) Date of Patent: Mar. 3, 2009

(54) EXPOSURE METHOD THAT OBTAINS, PRIOR TO EXPOSURE, RETICLE SURFACE FORM DATA AND MEASUREMENT POSITION ERROR, FOR SCANNING CONTROL

(75) Inventor: Kohei Maeda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/438,459

(22) Filed: May 23, 2006

(65) Prior Publication Data

US 2006/0273267 A1 Dec. 7, 2006

(30) Foreign Application Priority Data

Jun. 2, 2005 (JP) .............................. 2005-162718

(51) Int. Cl.
*H01L 21/027* (2006.01)
*G03B 27/42* (2006.01)
*G01N 21/00* (2006.01)

(52) U.S. Cl. ............................. 250/559.29; 250/559.39; 356/614; 355/53; 355/55

(58) Field of Classification Search ............ 250/559.19, 250/559.2, 559.22, 559.29, 559.39, 559.04, 250/559.06, 559.27, 559.45–559.49; 356/601, 356/610, 630, 614, 623; 382/141, 144, 145, 382/149; 355/53, 55, 60

See application file for complete search history.

(56) References Cited

U.S. PATENT DOCUMENTS

| | | | |
|---|---|---|---|
| 6,549,271 B2 | 4/2003 | Yasuda et al. ................. | 355/55 |
| 6,738,128 B2 | 5/2004 | Shima et al. .................. | 355/52 |
| 2005/0052633 A1 | 3/2005 | Mori et al. .................... | 355/53 |
| 2005/0112481 A1 | 5/2005 | Hirooka ....................... | 430/30 |
| 2005/0161615 A1 | 7/2005 | Maeda et al. ............. | 250/491.1 |
| 2005/0220332 A1 * | 10/2005 | Akutagawa et al. ......... | 382/144 |
| 2006/0273267 A1 | 12/2006 | Maeda ....................... | 250/548 |

FOREIGN PATENT DOCUMENTS

| | | |
|---|---|---|
| JP | 6-36987 | 2/1994 |
| JP | 10-214780 | 8/1998 |
| JP | 11-026345 | 1/1999 |
| JP | 2003-264136 | 9/2003 |
| JP | 2003-273008 | 9/2003 |
| JP | 2003-297726 | 10/2003 |
| JP | 2005-85991 | 3/2005 |
| WO | WO 03077030 A2 * | 9/2003 |

* cited by examiner

*Primary Examiner*—John R Lee
(74) *Attorney, Agent, or Firm*—Fitzpatrick, Cella, Harper & Scinto

(57) ABSTRACT

An exposure method for exposing a pattern of a reticle onto a plate, via a projection optical system, while synchronously scanning the reticle and the plate. The exposure method includes the steps of (a) measuring before exposing, the measuring step including (i) a first substep of obtaining surface form data that shows a surface form of the reticle, and (ii) a second substep of detecting a measurement position having an abnormal measurement result as an error measurement position among measurement positions, to measure the surface form of the reticle based on a measurement result of the obtaining substep, and (b) controlling synchronous scanning of the reticle and the plate using the measurement result of the detecting substep, except for the detecting result of the error measurement position.

2 Claims, 9 Drawing Sheets

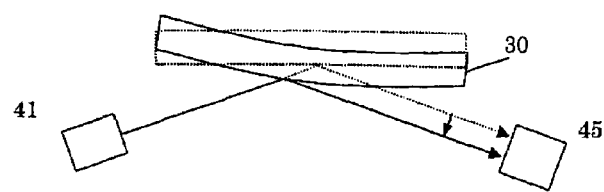
FIG. 2
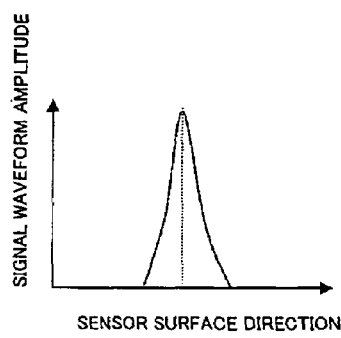
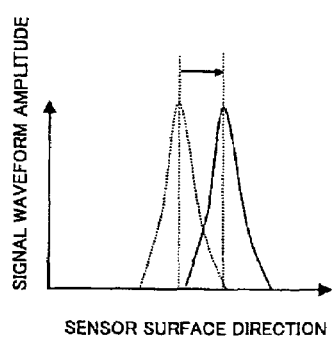
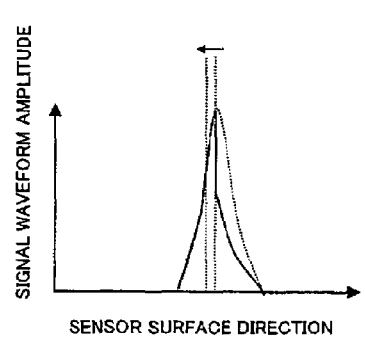
FIG. 3A     FIG. 3B     FIG. 3C

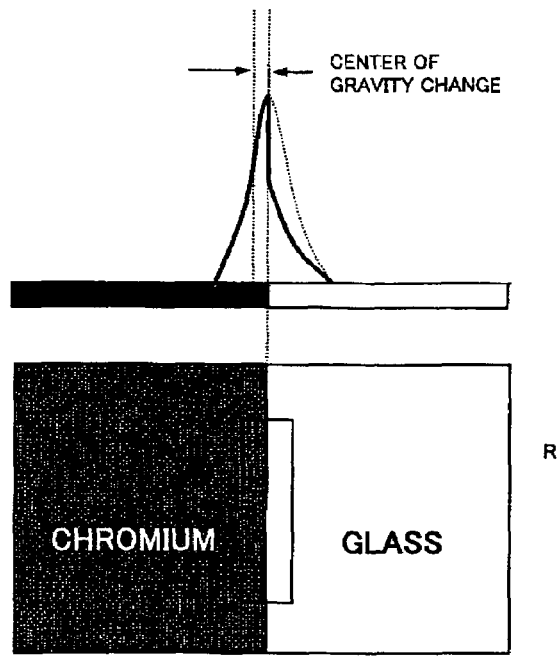
FIG. 4A
RETICLE PATTERN PART
FIG. 4B
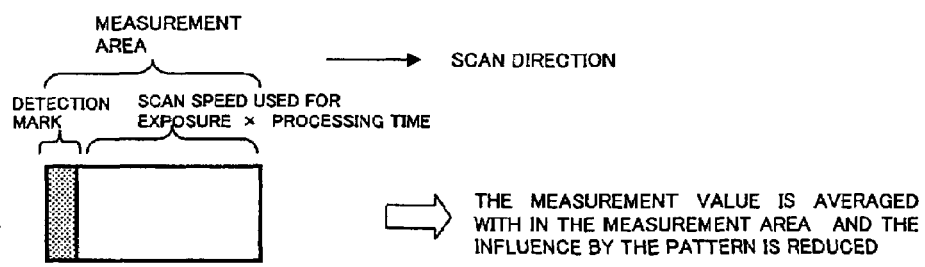
⇒ THE MEASUREMENT VALUE IS AVERAGED WITHIN THE MEASUREMENT AREA AND THE INFLUENCE BY THE PATTERN IS REDUCED
FIG. 5A
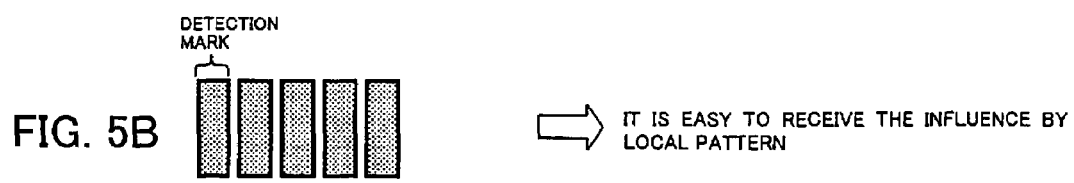
⇒ IT IS EASY TO RECEIVE THE INFLUENCE BY LOCAL PATTERN
FIG. 5B

EXPOSURE METHOD THAT OBTAINS, PRIOR TO EXPOSURE, RETICLE SURFACE FORM DATA AND MEASUREMENT POSITION ERROR, FOR SCANNING CONTROL

This application claims foreign priority benefit based on Japanese Patent Application No. 2005-162718, filed on Jun. 2, 2005, which is hereby incorporated by reference herein in its entirety as if fully set forth herein.

BACKGROUND OF THE INVENTION

The present invention relates generally to an exposure method and an apparatus that exposes a pattern of a reticle (mask) onto a plate to be exposed, such as a wafer, and, more particularly, to a detection of a surface form of the reticle. The present invention is suitable, for example, for a scanning type projection exposure apparatus that synchronously scans the reticle and the wafer to a projection optical system.

The photolithography technology for manufacturing fine semiconductor devices, such as semiconductor memory and logic circuits, has conventionally employed a reduction projection exposure apparatus that uses a projection optical system to project and transfer a reticle pattern onto a plate to be exposed. A numerical aperture (NA) of the projection optical system has recently increased. As a result, a focal depth has been further reduced. Then, an imaging error (a defocus or a distortion error) cannot be disregarded, and it is necessary to detect a surface form (a surface position or a deformation) of the reticle and to correct focus based on a detection result. Especially, an exposure apparatus in a step-and-scan manner (hereafter, "a scanner") that exposes the reticle pattern onto the plate, while synchronously scanning the reticle and the plate, needs a focus correction during scanning exposure.

It is necessary to measure the surface form of the reticle actually mounted in the exposure apparatus to correctly measure a deformation amount of the reticle. Therefore, a conventional detecting system irradiates a detection light to a pattern surface of the reticle (a grazing incidence method), receives reflected light from the pattern surface, and measures the surface form of the reticle. The detecting system measures the surface form of the reticle at a predetermined timing (for example, a predetermined time interval, one or plural shots, wafer or lot).

As conventional technology, for example, there are Japanese Patent Application, Publication No. 6-36987, Japanese Patent Application, Publication No. 10-214780, Japanese Patent Application, Publication No. 11-26345, and Japanese Patent Application, Publication No. 2003-264136. Moreover, as conventional technology, for example, there are Japanese Patent Application, Publication No. 2003-297726, Japanese Patent Application, Publication No. 2005-085991, and Japanese Patent Application, Publication No. 2003-273008.

However, an influence of the reticle pattern cannot be disregarded according to a demand of further increasing precision for the detecting system. For example, when the reticle is made of a glass substrate and the pattern is formed by chromium, a reflectivity in a pattern area (chromium) for the detection light is different from a reflectivity in a non-pattern area (glass substrate) for the detection light. When the detection light is irradiated, a boundary between the pattern area and the non-pattern area, as shown in FIG. 4B, a waveform of the reflected light changes and shifts from a Gaussian distribution as shown in FIG. 4A. As a result, a center of gravity position shifts from the original boundary (error measurement), a correct surface form of the reticle is undetectable, and transfer performance deteriorates.

It is difficult to increase the number of measurement points in a scanning direction, maintaining a scan speed and a processing speed of a measurement result. On the other hand, if the scan speed and the processing speed of a measurement result are delayed, and the number of measurement points in the scanning direction is increased, throughput decreases. If the reticle is moved in the scanning direction at a specific pitch and a still measurement is executed to the entire reticle pattern in the position, the error measurement position is manifested. However, this method causes the decrease of throughput similarly.

BRIEF SUMMARY OF THE INVENTION

Accordingly, the present invention is directed to an exposure method and apparatus that correctly detect a surface form of a reticle without causing a decrease of throughput.

In one aspect of the present invention, an exposure method is provided for exposing a pattern of a reticle onto a plate, via a projection optical system, while synchronously scanning the reticle and the plate, the exposure method including the steps of obtaining surface form data that shows a surface form of the reticle, and controlling synchronous scanning of the reticle and the plate based on the surface form data, wherein the surface form obtaining step includes the steps of detecting a measurement position having an abnormal measurement result as an error measurement position among measurement positions to measure the surface form of the reticle, and measuring the surface form of the reticle at a scan speed used for exposure, and wherein the controlling step uses, as the surface form data, a measurement result of the measuring step that excludes a measurement result with the error measurement position.

In another aspect of the present invention, an exposure apparatus is provided for exposing a pattern of a reticle onto a plate, via a projection optical system, while synchronously scanning the reticle and the plate, the exposure apparatus including a detecting system for detecting a position of the reticle in an optical axis of the projection optical system, and a controller for controlling synchronous scanning of the reticle and the plate based on a detection result of the detecting system, wherein the detecting system includes a first mode for detecting plural measurement positions of the reticle at a scan speed used for exposure, and a second mode for measuring a surface form of the reticle more fully than in the first mode.

Other objects and further features of the present invention will become readily apparent from the following description of the preferred embodiments with reference to the accompanying drawings.

BRIEF DESCRIPTION OF THE DRAWINGS

FIG. 2 is a schematic sectional view for explaining an influence of a detecting system when a reticle of the exposure apparatus shown in FIG. 1 changes.

FIGS. 3A to 3C are waveform diagrams as a detection result of the detecting system shown in FIG. 2.

FIG. 4A is a waveform diagram as a detection result when a detection light from the detecting system shown in FIG. 1 is irradiated to an edge of the reticle pattern, and FIG. 4B is a plan view of a pattern edge.

FIG. 5A is a schematic plan view for explaining an effect of a scan exposure on a reticle pattern surface, and FIG. 5B is a schematic plan view for explaining an effect of a still exposure by a second mode of the detecting system shown in FIG. 1.

DETAILED DESCRIPTION OF THE PREFERRED EMBODIMENTS

Figure 1:
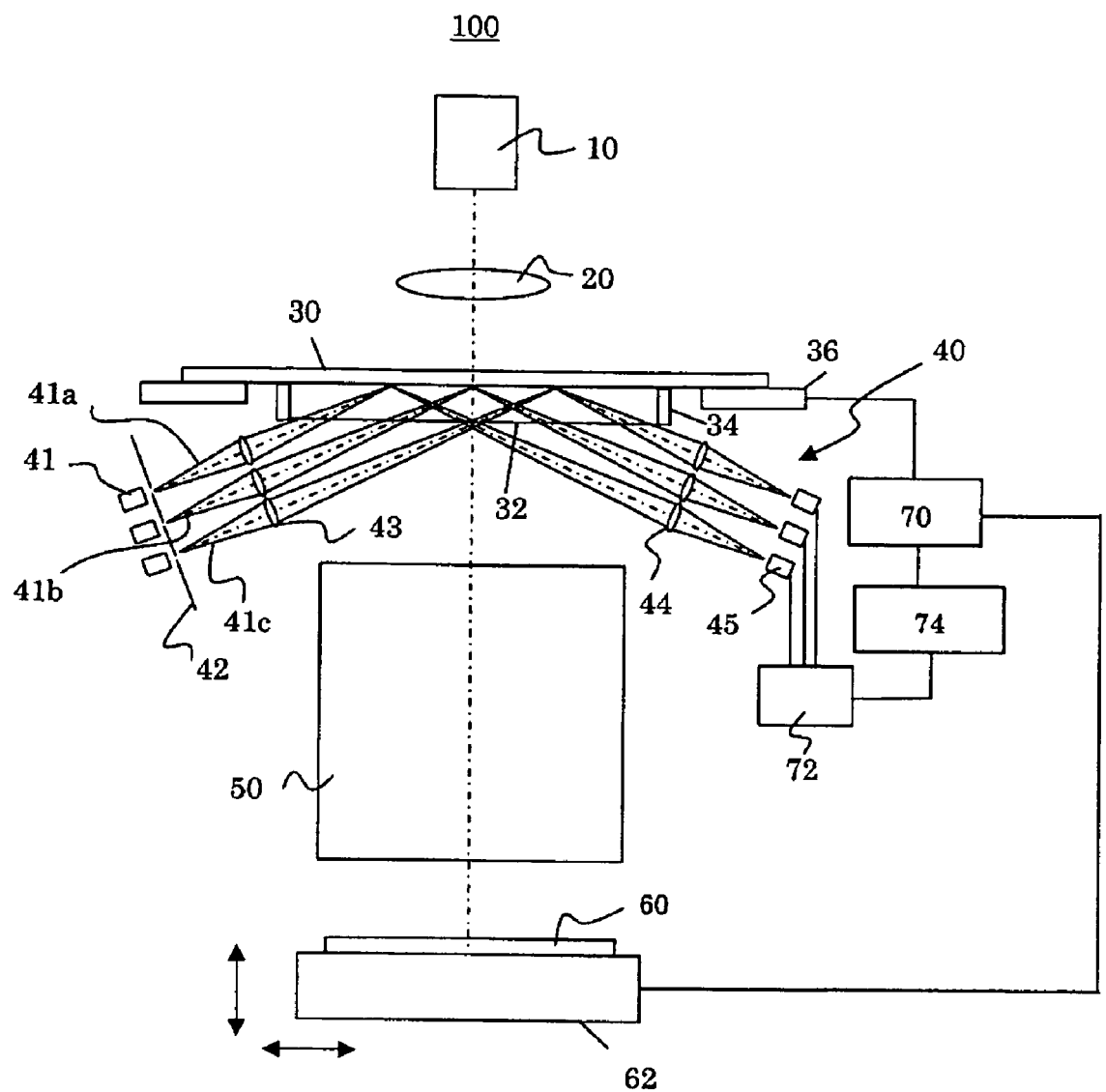
FIG. 1 is a schematic sectional view of an exposure apparatus of one aspect according to the present invention.

Hereafter, referring to FIG. 1, a description will be given of an exposure apparatus (scanner) 100 of one aspect according to the present invention. Here, FIG. 1 is a schematic sectional view of the exposure apparatus 100. The exposure apparatus 100 includes a light source section 10, an illumination optical system 20, a reticle stage 36, a detecting system 40, a projection optical system 50, a wafer stage 62, a controller 70, a memory 72, and an operation part 74.

The light source section 12 uses, for example, an ArF excimer laser with a wavelength of approximately 193 [nm], a KrF excimer laser with a wavelength of approximately 248 [nm], and an $F_2$ laser with a wavelength of approximately 157 [nm]. The kind and the number of lasers are not limited.

The illumination optical system 20 is an optical system that illuminates the reticle 30, and includes a lens, a mirror, an optical integrator, a stop, and the like, for example, a condenser lens, an optical integrator (a fly-eye lens), an aperture stop, a condenser lens, a slit, and an image-forming optical system, in this order. The optical integrator may include a fly-eye lens or an integrator formed by stacking two sets of cylindrical lens array plates (or lenticular lenses), and can be replaced with an optical rod or a diffractive element.

The reticle 30 forms a circuit pattern (or an image) to be transferred. Diffracted light emitted from the reticle 30 passes through the projection optical system 50, and is then projected onto a wafer 60. The reticle 30 and the wafer 60 are located in an optically conjugate relationship. Since the exposure apparatus 100 is a scanner, the reticle 30 and the wafer 60 are synchronously scanned at the speed ratio of the reduction ratio of the projection optical system 50, thus transferring the pattern from the reticle 30 to the wafer 60.

The reticle 30 is mounted on a moving part of the reticle stage 36. The reticle stage 36 supports the reticle 30 via a reticle holder (not shown) and drives the reticle 30. The reticle stage 36 is scanned by a linear motor (not shown). A pellicle 32 is provided in a bottom surface via a metal frame 34.

In FIG. 1, the reticle is held by a vacuum absorption of the reticle holder that is scanned in an orthogonal direction to a paper surface on the reticle stage 36 so that a pattern surface may become downward. In exposure, the entire pattern surface of the reticle 30 is projected by moving the moving part of the reticle stage 36 in a right-and-left direction shown by an arrow.

The detecting system 40 detects a surface form of the reticle 30 and is included in a fixing part of the reticle stage 36. The detecting system 40 has the same structure and the same function as that of a focus sensor in a grazing incident method, which accords a target exposed plane of the wafer 30 with an imaging plane of the projection optical system 50, and includes a light irradiating part and a light detector. The light irradiating part includes, as main elements, a light source for detection 41, such as a light emitting diode, a slit for a projection mark 42, and a projection lens 43. The light detector includes, as main elements, a receiver lens 44 and a detector 45, such as a CCD sensor.

Each member that constitutes the detecting part 40 may use any structure known in the art, thus, a detailed description is omitted.

The detecting part 40 has two modes. A first mode is a mode that detects plural measurement positions of the reticle 30 at a scan speed used for exposure. A second mode measures the surface form of the reticle 30 more fully than in the first mode, and is a preliminary mode to the first mode. The detecting system 40 executes the second mode and, next, executes the first mode described later.

When the detecting system 40 detects surface positions of the entire pattern surface of the reticle 30, the moving part of the reticle stage 36 is scanned similar to scan projection exposure. Moreover, the detecting system 40 can irradiate three or more detection lights 41a to 41c in the orthogonal direction to the paper surface and detects surface positions using those detection lights. An inclination and surface position precision of the reticle 30 can be improved by using three or more detection lights. Since the detecting system 40 is included in the fixing part of the reticle stage 36, it can easily adjust a correlation at a unit assembly, can timely reduce change, and can detect the surface position of the reticle 30 with high precision.

The pattern surface detection position of the reticle 30 detected by the detecting system 40 preferably provides a position that almost accords with a projected position by the projection optical system 50. In other words, an optical axis of the projection optical system 50 and the detection light from the detecting system 40 preferably intersect on the pattern surface of the reticle 30 in FIG. 1. Actually, a projection exposure area has a width of several mm to several tens of mm in the right-and-left direction, centering on the optical axis and the same depth as a depth of the projection exposure area of the reticle pattern surface (a depth of an area which the pattern projected is formed) in the orthogonal direction to the paper surface. A detection area that has the surface position detected by the detecting system 40 on the reticle pattern surface adjusts so that it includes an illumination area on the reticle (including the case that the detection area is the same as the projection exposure area). Thereby, a scan range of the reticle stage 40 becomes the minimum, the structure of the reticle stage 40 can be simplified, and the entire apparatus can be miniaturized. The detecting system 40 to the illumination area is arranged so that the irradiation position of the detection light on the reticle 30 shifts in an orthogonal direction to the scanning direction and is arranged so that it overlaps in the scanning direction. This arrangement may be another arrangement to optimize the surface detection precision.

Moreover, a shape of the illumination area may be an arc shape, an arc shape that excludes the optical axis of the projection optical system, or another shape. The high precision reticle surface position that excludes a position error of the reticle stage 36 is detected by detecting the reticle surface position at the exposure position.

The projection optical system 50 exposes the reticle pattern illuminated by the exposure light from the illumination optical system 20 onto the wafer 60 at a predetermined magnification (for example, ¼ or ⅕). The projection optical system 50 may use a dioptric system comprised solely of a plurality of lens elements, a catadioptic optical system including a plurality of lens elements and at least one concave mirror, and a catoptric system comprised solely of a plurality of mirror elements.

The wafer 60 is a plate to be exposed. The plate is a liquid crystal substrate in another embodiment. A photoresist is applied to the wafer 60. The wafer 60 is mounted on the wafer stage 62 that can drive the wafer 60 in the XYZ and inclination directions so that exposure of the entire wafer, scan exposure and focus correction may be possible. The wafer stage 62 may use any structure known in the art. Thus, a detailed description of its structure and operation is omitted. The wafer stage 62 may use, for example, a linear motor to move the wafer 60. The reticle 30 and wafer 60 are, for example, synchronously scanned, and the positions of the reticle stage 36 and the wafer stage 62 are monitored, for example, by a laser interferometer, and the like, so that both are driven at a constant speed ratio. The wafer stage 62 is installed on a stage stool supported on the floor, and the like, for example, via a damper.

Figure 10:
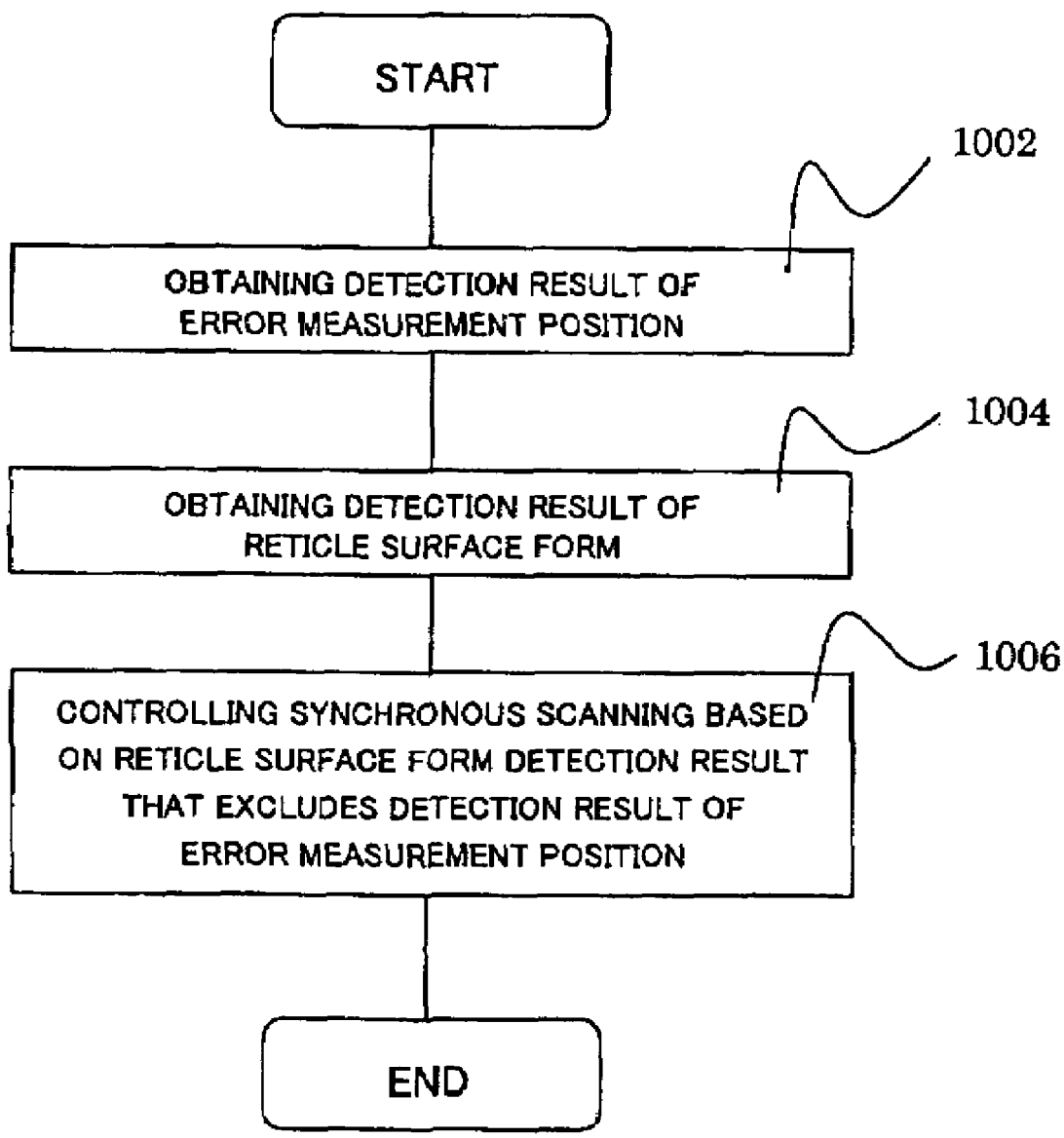
FIG. 10 is a flowchart for explaining an operation of the controller shown in FIG. 1.

The controller 70 controls each part and executes an exposure method shown in FIG. 10. Here, FIG. 10 is a flowchart of the exposure method. A step 1002 and a step 1004 shown in FIG. 10 may be executed by the operation part 74. The operation part 74 and the controller 70 may be combined.

First, a detection result of an error measurement position is obtained from the detecting system 40 (step 1002). This step corresponds to the second mode of the detecting system 40 described later. Concretely, step 1002 includes the steps of obtaining detailed data of the reticle surface form and discriminating the error measurement position based on the data. The obtaining method of detailed data of the reticle surface form is described later with reference to FIGS. 5B, 6B and 7. The discriminating method of the error measurement position is described later with reference to FIGS. 8 and 9.

Next, the detection result of the reticle surface form is obtained from the detecting system 40 (step 1004). This step corresponds to the first mode of the detecting system 40 described later. The step 1004 is a conventional detection operation of the reticle surface form by the detecting system 40. The number of measurement points must be maintained to a predetermined number to maintain the scan speed and the processing speed of the measurement result.

Finally, synchronous scanning of the reticle 30 and wafer 60 is controlled based on the detection result of the reticle surface form that excludes the detection result of the error measurement position (step 1006). The detection result of the reticle surface form that excludes the detection result of the error measurement position (surface form data) may be the same time with the step 1004 or between the step 1004 and the step 1006. In other words, if the error measurement position detected by step 1002 is removed from measurement positions before the step 1004, the detection result of step 1004 becomes the surface form data. On the other hand, if the error measurement position detected by step 1002 is not removed from measurement positions before step 1004, a result removed the detection result of the step 1002 from the detection result of step 1004 becomes the surface form data.

In step 1006, a main correcting part that controls synchronous scanning corrects the scan position of the wafer stage 62, in other words, a position in a height direction or inclination according to the surface form. Moreover, the correcting part may correct the imaging plane form to a form corresponding to the surface form of the reticle pattern surface by driving the optical element in the projection optical system 50, or may correct the reticle surface form itself.

A description will be given of the obtaining method of detailed data of the reticle surface form in the step 1002. The second mode of the detecting system 40 is a mode that detects, as the error measurement position, the measurement position including an abnormal measurement result. In the detecting system 40, the detection light from the light source 41 is grazing incident upon the reticle surface shown with a broken line, and the reflected light is incident upon the detector 45 as shown in FIG. 2. The detector 45 can detect the waveform as shown in FIG. 3A, and the operation part 74 detects the position of the reticle surface by converting the center of gravity position of the waveform into the position information. For example, the reticle surface deforms, as shown as a solid line of FIG. 2, the detection light, which is reflected by the reticle surface and is incident on the light detecting system, shifts in an arrow direction shown as a solid line of FIG. 2. In this case, the detection waveform (center of gravity position) detected by the detector 45 shifts from an original waveform position according to the pattern surface form as shown in FIG. 3B. The surface position in the Z direction is detected from this shift amount.

Figure 6A:
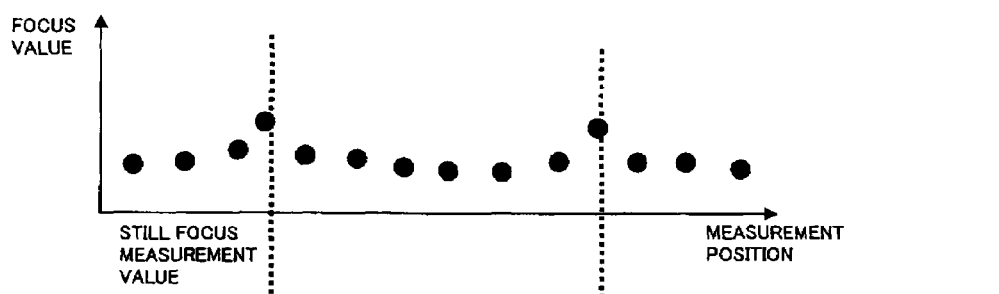
FIG. 6A is a graph of a relationship between a measurement position corresponding to FIG. 5A and a focus value.

However, as shown in FIG. 3C, if the detection light is irradiated to the edge of the pattern when the reticle pattern surface is measured, the waveform detected by the detecting system 40 does not shift, but collapses. Therefore, as shown in FIG. 4A, the center of gravity shifts from the edge of the chromium pattern shown in FIG. 4B, and the error position of the pattern surface in the Z direction is measured. The measurement result is averaged by the size of the slit for the projection mark 42, and the scan during the store of the measurement value and processing. Thereby, the error measurement amount is reduced, and the error measurement position becomes indefinite. FIG. 5A is a plan view when the measurement area on the reticle pattern surface is measured by scanning at the scan speed used for exposure. FIG. 6A is a graph of a relationship between the measurement position and the focus value, corresponding to FIG. 5A.

Figure 6B:
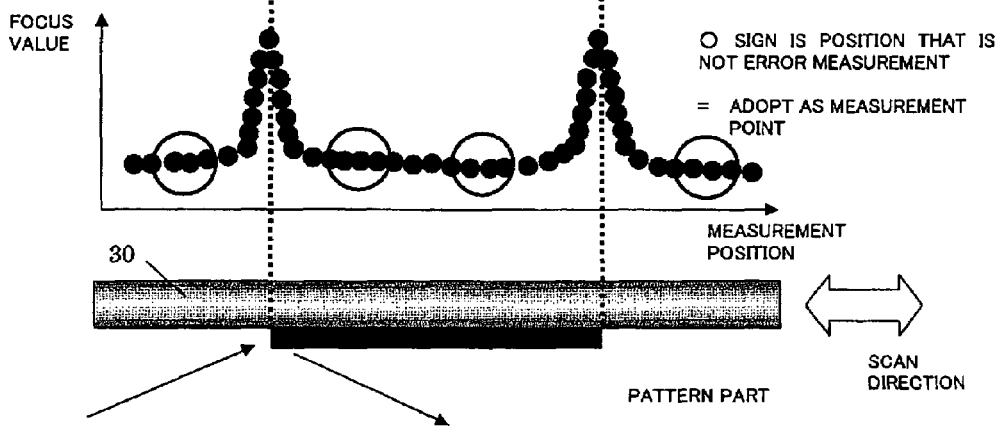
FIG. 6B is a graph of a relationship between a measurement position and a focus value, corresponding to FIG. 5B.

Here, the second mode in the instant embodiment moves the reticle stage 36 at regular step intervals along the scanning direction, and executes the still measurement at this position. This operation is executed to the entire reticle surface position measurement area, and the error measurement position is manifested. In this case, the controller 70 controls the reticle stage 36 so that the reticle 30 is still whenever stepping the reticle 30 in the scanning direction. FIG. 5B is a plan view when the still measurement is executed to the measurement area on the reticle pattern surface. FIG. 6B is a graph of a relationship between the measurement position and the focus value, corresponding to that shown in FIG. 5B.

The controller 70 generates the surface form data from the detection result by the detecting system 40 of the first mode, which excludes the measurement result of the error measurement position (in other words, the detection result of the second mode) by storing the error measurement position in the memory 72. Moreover, the controller 70 controls synchronous scanning of the reticle 30 and wafer 60 based on the surface form data. When the surface form data is generated, the detection result of the second mode is removed from the detection result of the first mode or the measurement point of the error measurement position is not used as the measurement point of the first mode.

Figure 7:
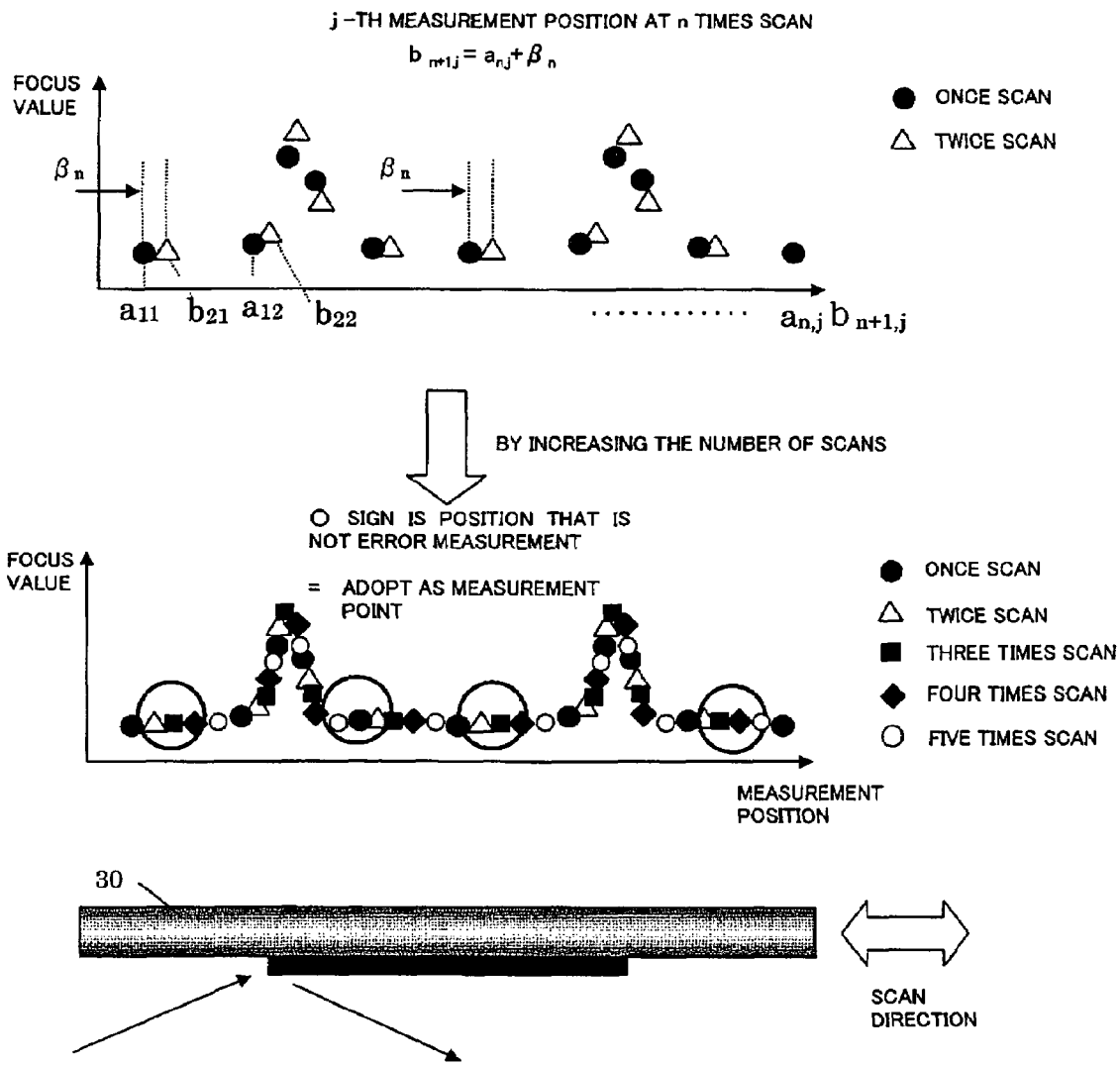
FIG. 7 is a view for explaining an effect of a scan exposure by a second mode of the detecting system shown in FIG. 1.

Referring to FIG. 7, a description will be given of the second mode replaced with the still measurement shown in FIG. 5B. This embodiment is scanned once in one direction at the scan speed used for exposure and measures the reticle surface position in the second mode. The measurement point at this time is set to $a_{n,j}$. Here, n is the number of scans, and j is a measurement position number (however, the scanning direction shows only one column of the measurement). Next, this embodiment scans in an opposite direction again. At this time, each measurement point is measured at a position of $b_{n+1,j}=a_{n,j}+\beta_n$ that shifts from the previously measurement point by a predetermined distance $\beta_n$ (n: the number of scans). In this case, the controller 70 controls the reticle stage 36 so that plural measurement positions shift. The error measurement position by the pattern shown in FIG. 7 can be manifested by repeating the measurement plural times. At this time, the measurement value is averaged by the size of the slit for the projection mark 42 and the scan during the store of the measurement value and processing as mentioned above, although the error measurement amount is reduced, the error measurement amount can be quantification.

Next, a description will be given of the discriminating method of the error measurement position by the controller 70 in step 1002.

Figure 8:
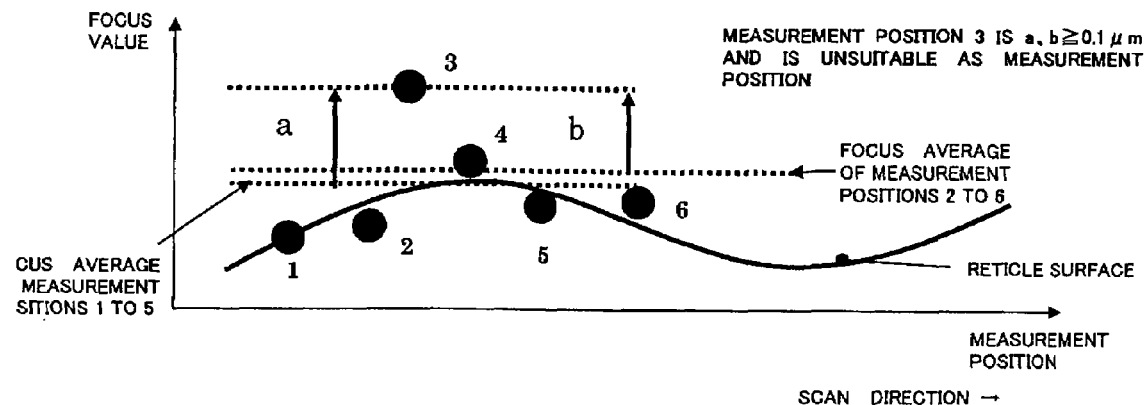
FIG. 8 is graph of a relationship between a measurement position and a focus value, for explaining one example of a discriminating method of an error measurement position by the controller shown in FIG. 1.

A first method averages, as shown in FIG. 8, the measurement value obtained by executing the measurement shown in FIG. 5B or FIG. 7 to the entire reticle pattern area by the measurement positions one to five, for instance, and averages it by the measurement positions two to six. Thus, the operation that shifts one by one measurement position and averages the measurement value is repeated. The number of measurement points to average can be determined arbitrarily. Then, a difference between these measurement raw values (for example, five raw values used for average) and an average value is obtained (a, b). This is defined as the error measurement amount. A point that is larger than a predetermined threshold (for example, 0.1 μm) among the difference value as the error measurement amount is checked. At this time, the measurement position checked plural times is discriminated as the error measurement position, and is not used as the measurement point, or is not used as a reticle approximate surface sample point. In FIG. 8, the measurement position 3 is the error measurement position.

Figure 9:
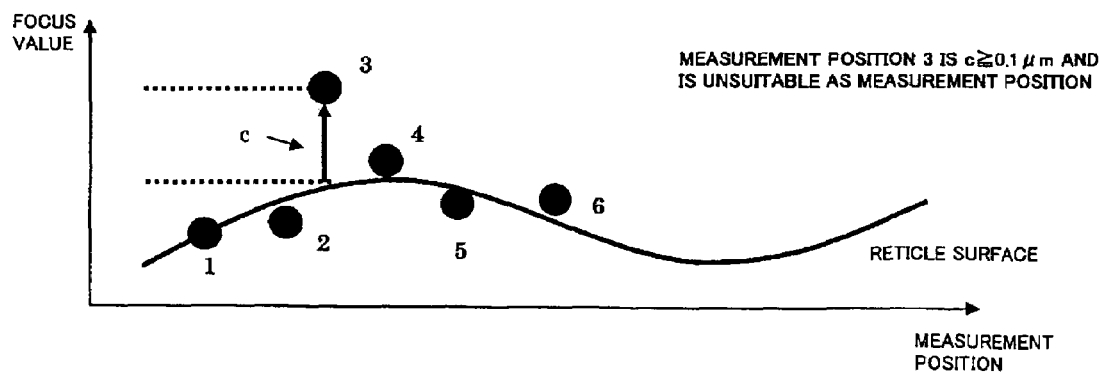
FIG. 9 is graph of a relationship between a measurement position and a focus value, for explaining another example of a discriminating method of an error measurement position by the controller shown in FIG. 1.

A second method obtains, as shown in FIG. 9, an approximate curve using all measurement points and discriminates, as the error measurement position, a measurement position that the difference amount from the approximate curve exceeds the predetermined threshold (for example, 0.1 μm).

In the first mode, the detecting system 40 measures the surface form of the entire reticle 30 by scanning the reticle 30 before exposure. At this time, the error measurement position detected in the second mode is not measured in the first mode, or even if the error measurement position detected in the second mode is measured, a measurement value is removed. The reticle stage 36 has a function that scans the reticle 30 at scan exposure and a function that scans the reticle 30 at detection of the reticle surface position, and achieves the miniaturization of the apparatus and simplification of the structure. Since the detecting system 40 is a part of the reticle stage 36, the detecting system 40 is stabilized to the reticle scan, and highly precision reticle surface position detection is achieved.

Moreover, the reticle pattern surface detection position detected by the detecting system 40 is arranged to approximately accord a position projected by the projection optical system 50. Thereby, the scan range of the reticle stage 36 can be the minimum, the simplification of the structure of the reticle stage 36 and the miniaturization of the apparatus are achieved, and highly precision reticle surface position detection and highly precision scan projection exposure according to the reticle surface position detection are achieved.

The surface form detected by the detecting system 40 in the first and second modes is stored in the memory 72, and the operation part 74 calculates the approximate surface of the entire reticle 30. The deformation information in the scanning direction is sent to the wafer stage 62, and the wafer stage 62 is corrected so that the focus drive amount in scan exposure becomes optimal. When it is judged that there is trouble in the imaging performance of exposure based on the measurement result of the surface form of the reticle, the detecting system 40 sends a signal to the reticle stage 36 through the controller 70, and has a function as a caution part that recommends an exchange and re-installation of the reticle.

In exposure, the light emitted from the light source section 10 is incident upon the illumination optical system 20 and uniformly illuminates the reticle 30. The image of the pattern formed on the reticle 30 is projected onto the wafer 60 through the projection optical system 50. One shot is exposed by relatively scanning the reticle 30 and the wafer 60 in the orthogonal direction to the paper surface. In other words, the surface position of the reticle 30 is detected by irradiating the detection light to the pattern surface of the reticle 30 from the light irradiation part and detecting the reflected light at the light detector. The controller 70 controls synchronous scanning for the deformation of the reticle 30 based on the surface form of the reticle 30. Therefore, the exposure apparatus 100 transfers the pattern onto the resist with high precision and provides high-quality devices (such as semiconductor devices, LCD devices, photographing devices (such as CCDs, etc.), thin film magnetic heads, and the like).

Figure 11:
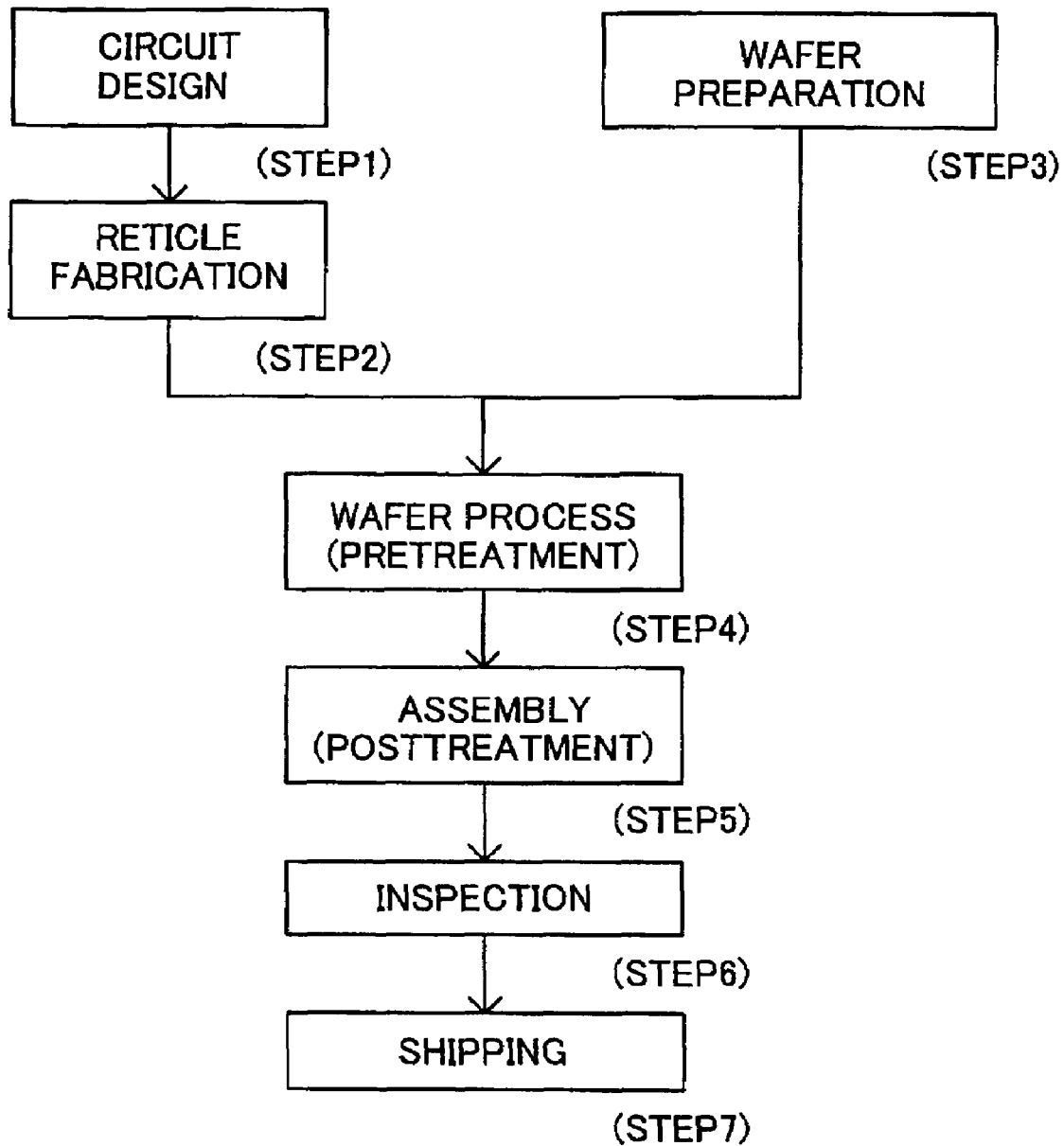
FIG. 11 is a flowchart for explaining a method of fabricating devices (e.g., semiconductor chips, such as ICs, LSIs, and the like, LCDs, CCDs, etc.).
Figure 12:
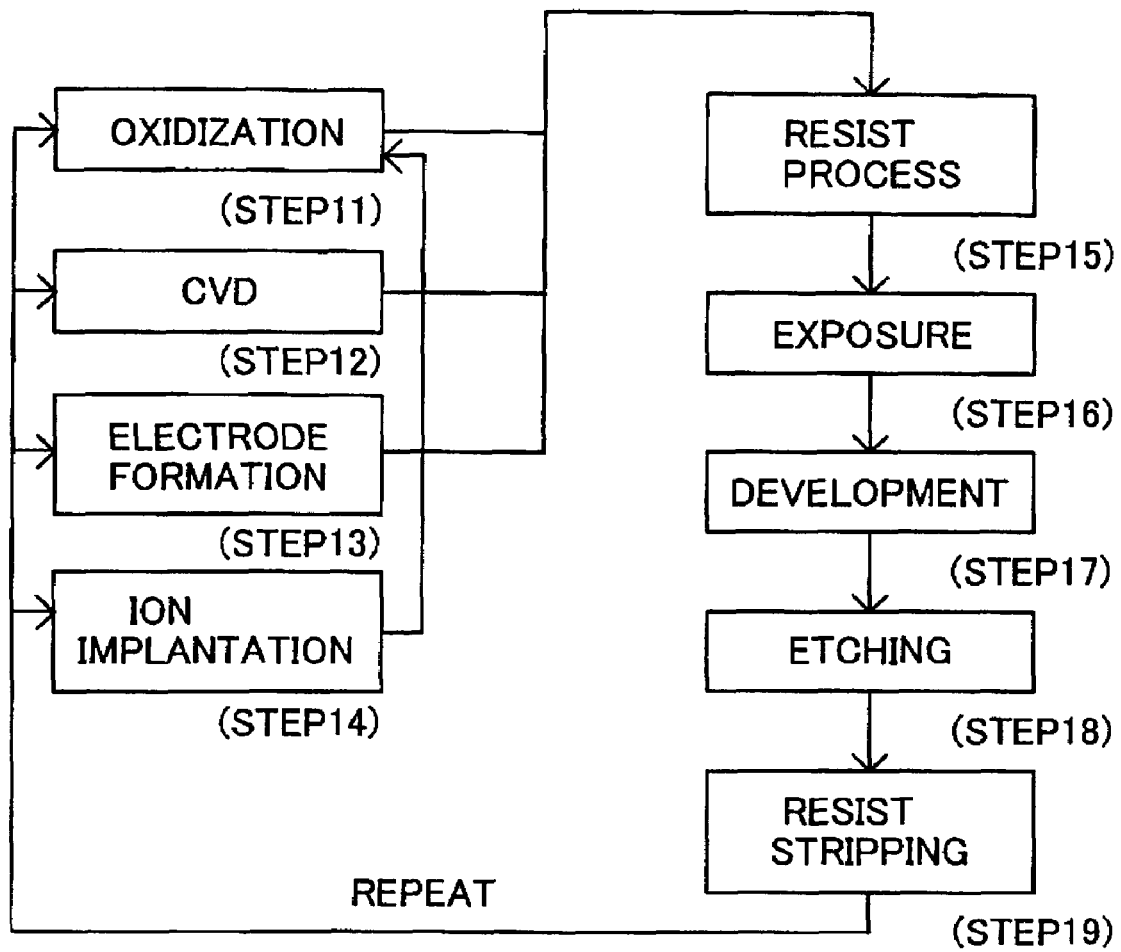
FIG. 12 is a detailed flowchart of a wafer process shown in Step 4 of FIG. 11.

Referring now to FIGS. 11 and 12, a description will be given of an embodiment of a device fabrication method using the above-mentioned exposure apparatus 100. FIG. 11 is a flowchart for explaining how to fabricate devices (i.e., semiconductor chips, such as ICs and LSIs, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 12 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition, and the like. Step 14 (ion implantation) implants ions into the wafer. Step 15 (resist process) applies a photosensitive material onto the wafer. Step 16 (exposure) uses the exposure apparatus 100 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than does the conventional one. Thus, the device fabrication method using the exposure apparatus 100, and resultant devices, constitute one aspect of the present invention.

Furthermore, the present invention is not limited to these preferred embodiments, and various variations and modifications may be made without departing from the scope of the present invention.

What is claimed is:

1. An exposure method for exposing a pattern of a reticle onto a plate, via a projection optical system, while synchronously scanning the reticle and the plate, said exposure method comprising:
   - a first measuring step of measuring a surface shape of the reticle;
   - a determining step of determining an error measurement position based on a measuring result of said first measuring step;
   - a second measuring step of remeasuring the surface shape of the reticle without measuring the error measurement position; and
   - a controlling step of controlling synchronous scanning of the reticle and the plate based on a measuring result of said second measuring step, wherein said first measuring step includes:
   - (i) a first substep for measuring a surface position of the reticle at plural measurement positions that are arranged in a scanning direction by scanning the reticle at a scan speed used for exposure; and
   - (ii) a second substep for measuring the surface position of the reticle at positions that are shifted from the plural measurement positions in the scanning direction by an equal distance by scanning the reticle in a direction opposite to that of said first substep at the scan speed used for exposure.

2. An exposure method for exposing a pattern of a reticle onto a plate, via a projection optical system, while synchronously scanning the reticle and the plate, said exposure method comprising:
   - a first measuring step of measuring a surface shape of the reticle;
   - a determining step of determining an error measurement position based on a measuring result of said first measuring step;
   - a second measuring step of remeasuring the surface shape of the reticle; and
   - a controlling step of controlling synchronous scanning of the reticle and the plate based on a measuring result other than the error measurement position among the measuring result of said second measuring step, wherein said first measuring step includes:
   - (i) a first substep for measuring a surface position of the reticle at plural measurement positions that are arranged in a scanning direction by scanning the reticle at a scan speed used for exposure; and
   - (ii) a second substep for measuring the surface position of the reticle at positions that are shifted from the plural measurement positions in the scanning direction by an equal distance by scanning the reticle in a direction opposite to that of said first substep at the scan speed used for exposure.

* * * * *